(12) United States Patent
Meacham

(10) Patent No.: US 7,058,360 B1
(45) Date of Patent: Jun. 6, 2006

(54) METHOD AND SYSTEM FOR STABILIZING THE PERFORMANCE VARIATION OF A RADIO FREQUENCY DEVICE

(75) Inventor: Daniel R. Meacham, La Jolla, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 389 days.

(21) Appl. No.: 10/071,150

(22) Filed: Feb. 8, 2002

Related U.S. Application Data

(60) Provisional application No. 60/267,365, filed on Feb. 8, 2001.

(51) Int. Cl.
*H01Q 11/12* (2006.01)
*H04B 1/04* (2006.01)

(52) U.S. Cl. .............. 455/63.1; 455/119; 455/316; 330/259; 330/270; 330/290

(58) Field of Classification Search ............ 455/126, 455/127.1, 127.2, 127.3, 240.1, 247.1, 250.1, 455/232.1, 251.1, 316, 334, 333, 343.1, 63.1, 455/119; 330/285, 270, 290, 291, 294, 296, 330/259

See application file for complete search history.

(56) References Cited

U.S. PATENT DOCUMENTS

| | | | | |
|---|---|---|---|---|
| 5,542,113 A | * | 7/1996 | Fink et al. | 455/119 |
| 5,548,811 A | * | 8/1996 | Kumagai et al. | 455/192.2 |
| 5,589,796 A | * | 12/1996 | Alberth et al. | 330/133 |
| 5,625,322 A | * | 4/1997 | Gourgue et al. | 330/129 |
| 5,631,601 A | * | 5/1997 | Horsfall et al. | 329/325 |
| 5,900,765 A | * | 5/1999 | Kawasaki et al. | 327/362 |
| 6,111,466 A | * | 8/2000 | Mokhtar et al. | 330/296 |
| 6,351,189 B1 | * | 2/2002 | Hirvilampi | 330/296 |
| 6,407,639 B1 | * | 6/2002 | Jean et al. | 330/298 |
| 6,434,187 B1 | * | 8/2002 | Beard et al. | 375/219 |
| 6,437,647 B1 | * | 8/2002 | Fowler | 330/288 |

* cited by examiner

*Primary Examiner*—Simon Nguyen

(57) ABSTRACT

A method for stabilizing the performance variation of a primary radio frequency (RF) device is provided that includes providing a secondary RF device. An output signal is generated with the secondary RF device. The output signal is provided to a feedback circuit. A feedback signal is generated based on the output signal with the feedback circuit. The feedback signal is provided to the secondary RF device. The output signal is generated based on the feedback signal. The feedback signal is provided to the primary RF device.

20 Claims, 2 Drawing Sheets

METHOD AND SYSTEM FOR STABILIZING THE PERFORMANCE VARIATION OF A RADIO FREQUENCY DEVICE

The present application claims priority as a non-provisional counterpart application to U.S. provisional application Ser. No. 60/267,365 entitled "METHOD AND APPARATUS FOR REDUCING PERFORMANCE VARIATION OF RF CIRCUITS" and filed Feb. 8, 2001. The content of the above-identified application is incorporated herein by reference.

TECHNICAL FIELD OF THE INVENTION

The present invention is directed, in general, to radio frequency circuits and, more specifically, to a method and system for stabilizing the performance variation of a radio frequency device.

BACKGROUND OF THE INVENTION

Radio frequency (RF) circuits are widely used in a variety of applications, including communication systems, radio and television broadcasting, radar, and the like. In addition, many circuit blocks, such as receivers, transmitters, modulators, filters, transmission lines, oscillators, frequency synthesizers, and low-noise amplifiers, extensively use RF integrated circuits.

The use of RF integrated circuits, however, is not without problems. For example, the performance and the production yield for an RF integrated circuit are negatively affected by the variation in for the transistor device across temperature, the DC supply voltage, and manufacturing process variation.

To overcome these potential problems, conventional design schemes rely on voltage—and temperature-sensing circuits that adjust the bias points of the RF devices. However, a significant disadvantage with these design schemes is the reliance on empirical relationships between RF performance and temperature and between RF performance and supply voltage. Due to the inexact nature of these relationships, substantial chip-to-chip variation in RF performance results from the use of these conventional design schemes. Compensation for this variation is typically accomplished by increasing the performance margin of the entire system, which also substantially increases the cost of the system.

SUMMARY OF THE INVENTION

In accordance with the present invention, a method and system for stabilizing the performance variation of a radio frequency (RF) device are provided that substantially eliminate or reduce disadvantages and problems associated with conventional systems and methods. In particular, the RF performance of a particular RF device is directly measured, and the resulting measurement is used to stabilize the gain of another RF device over temperature, process, and supply variation.

According to one embodiment of the present invention, a method for stabilizing the performance variation of a primary RF device is provided that includes providing a secondary RF device. An output signal is generated with the secondary RF device. The output signal is provided to a feedback circuit. A feedback signal is generated based on the output signal with the feedback circuit. The feedback signal is provided to the secondary RF device. The output signal is generated based on the feedback signal. The feedback signal is provided to the primary RF device.

According to another embodiment of the present invention, a system for stabilizing the performance variation of a primary RF device is provided that includes a secondary RF device and a feedback circuit. The secondary RF device is operable to generate an output signal. The feedback circuit is coupled to the secondary RF device. The feedback circuit is operable to receive the output signal, to generate a feedback signal based on the output signal, to provide the feedback signal to the secondary RF device, and to provide the feedback signal to the primary RF device. The secondary RF device is further operable to generate the output signal based on the feedback signal.

According to yet another embodiment of the present invention, a system for processing an RF signal is provided that includes a primary RF device and a bias point stabilizer. The bias point stabilizer is coupled to the primary RF device. The bias point stabilizer includes a secondary RF device and is operable to generate a feedback signal and to provide the feedback signal to the primary RF device. The feedback signal is operable to stabilize the primary RF device.

Technical advantages of one or more embodiments of the present invention include providing an improved method for stabilizing the performance variation of a primary RF device. In a particular embodiment, a secondary RF device with characteristics analogous to the primary RF device is included as part of the circuit. As a result, the RF performance of the secondary RF device may be directly measured, and the resulting measurement may be applied to the primary RF device. Accordingly, the gain of the primary RF device over temperature, process, and supply variation may be stabilized based on a direct measurement as opposed to an empirical relationship.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
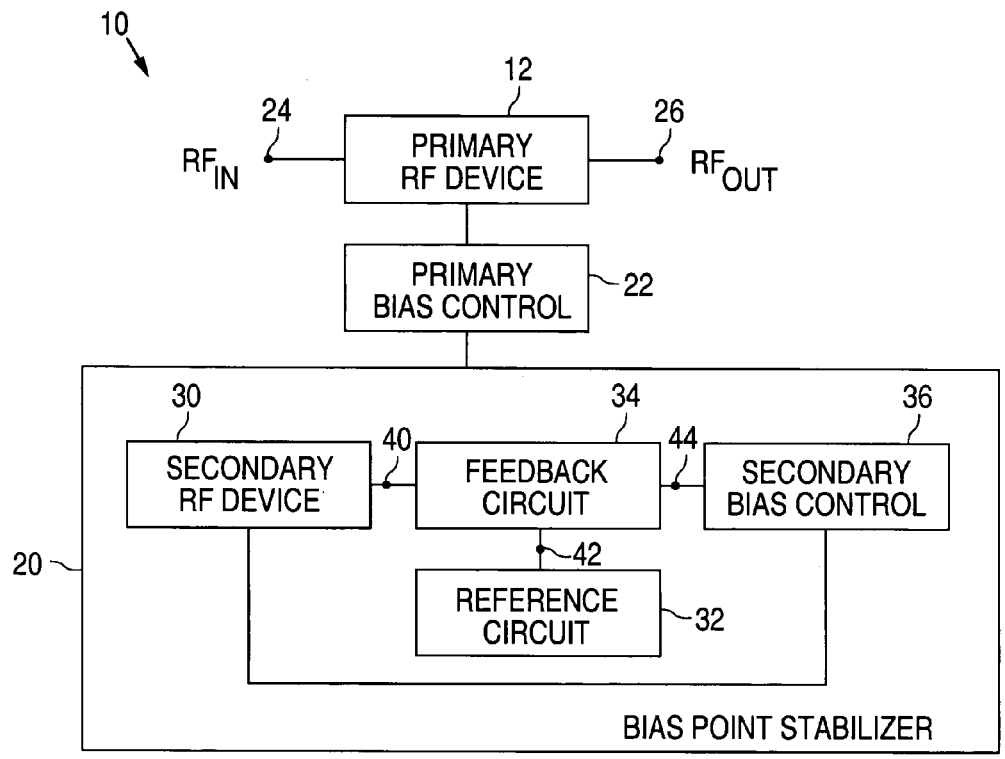
FIG. 1 is a block diagram illustrating a system for stabilizing the performance variation of a radio frequency (RF) device in accordance with one embodiment of the present invention.
Figure 2:
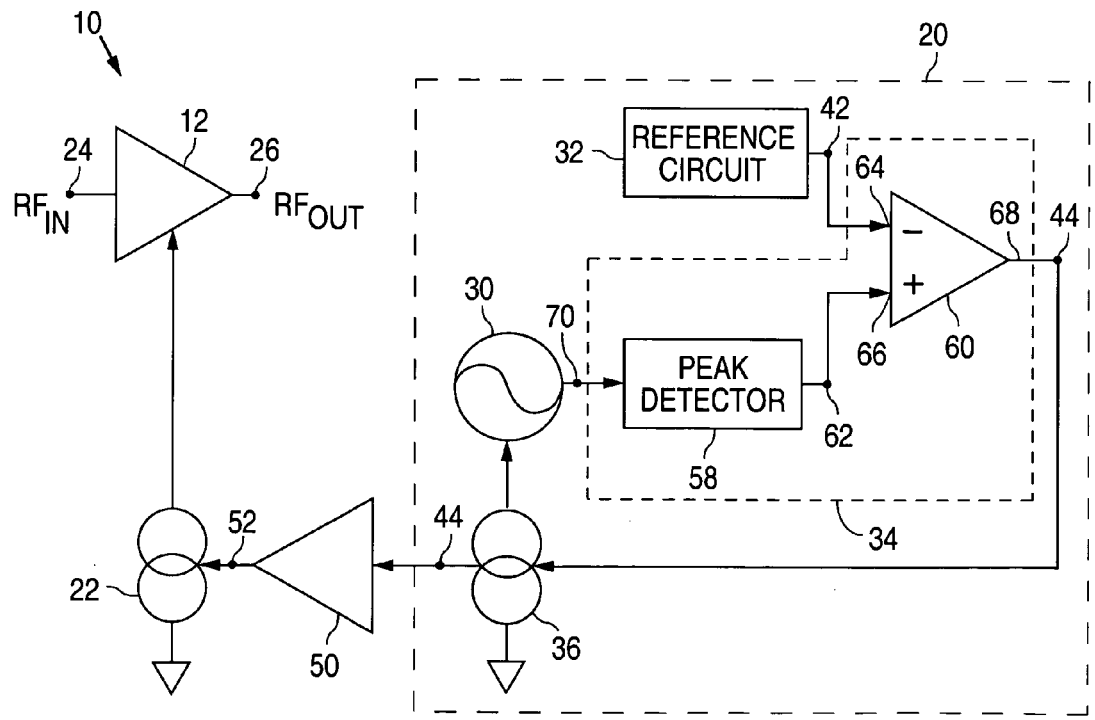
FIG. 2 is a block diagram illustrating details of the system of FIG. 1 in accordance with one embodiment of the present invention.
Figure 3:
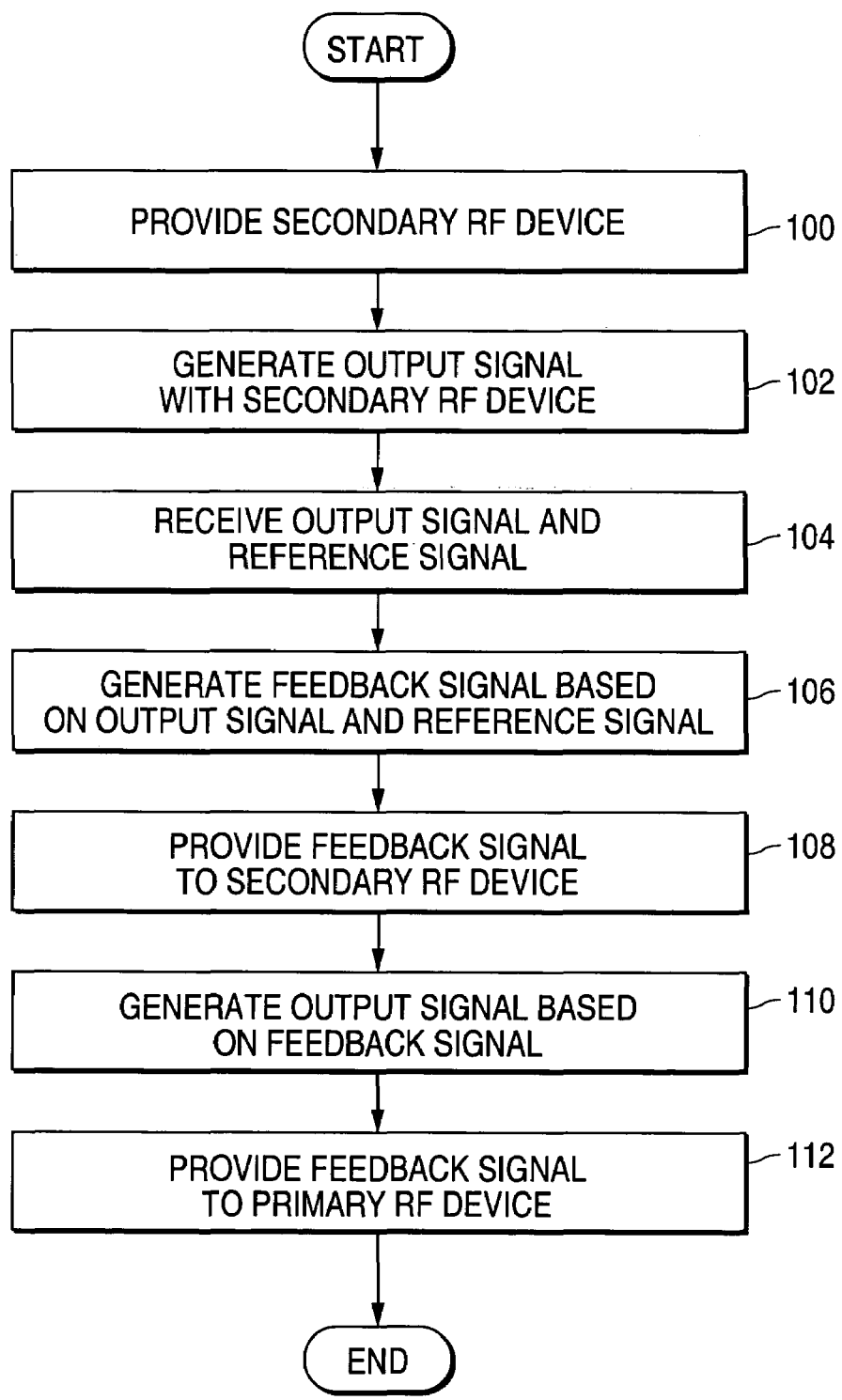
FIG. 3 is a flow diagram illustrating a method for stabilizing the performance variation of the primary RF devices of FIGS. 1 and 2 in accordance with one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) circuit.

FIG. 1 is a block diagram illustrating a system 10 for stabilizing the performance variation of a primary RF device 12 in accordance with one embodiment of the present invention. In addition to the primary RF device 12, the system 10 comprises a bias point stabilizer 20 and a primary bias control 22.

The primary RF device 12 is operable to receive an RF input signal 24 and to generate an RF output signal 26. The primary RF device 12 may comprise an amplifier, a mixer, a synthesizer, or other suitable device operable to process an RF signal.

The bias point stabilizer 20 is coupled to the primary RF device 12 through the primary bias control 22, which is operable to stabilize the primary RF device 12 based on a signal from the bias point stabilizer 20. According to one embodiment, the bias point stabilizer 20 comprises a secondary RF device 30, a reference circuit 32, a feedback circuit 34, and a secondary bias control 36.

The secondary RF device 30 is operable to generate an output signal 40 for the feedback circuit 34. The secondary RF device 30 comprises characteristics that are analogous to the characteristics of the primary RF device 12. For example, according to one embodiment, the secondary RF device 30 comprises transistors and other circuit components that are the same size as, or a specified multiple or fraction of, the transistors and other circuit components of the primary RF device 12.

Thus, due to the analogous characteristics of the secondary RF device 30, the RF performance of the secondary RF device 30 may be measured by the bias point stabilizer 20 in order to determine the appropriate signal to provide to the primary bias control 22 such that the primary RF device 12 is stabilized. As described in more detail below in connection with FIG. 2, the secondary RF device 30 comprises an oscillator.

The reference circuit 32 is operable to provide a relatively stable reference signal 42, such as a reference voltage, to the feedback circuit 34. Thus, the reference circuit 32 may comprise a band-gap reference circuit or any other suitable circuit operable to provide the reference signal 42.

The feedback circuit 34 is coupled to the secondary RF device 30 and to the reference circuit 32. The feedback circuit 34 is operable to receive the output signal 40 from the secondary RF device 30 and the reference signal 42 from the reference circuit 32. The feedback circuit 34 is also operable to generate a feedback signal 44 based on the output signal 40 and the reference signal 42.

The secondary bias control 36 is coupled to the feedback circuit 34 and to the secondary RF device 30. The secondary bias control 36 is operable to provide the feedback signal 44 from the feedback circuit 34 to the secondary RF device 30. The secondary RF device 30 is also operable to generate the output signal 40 based on the feedback signal 44 from the secondary bias control 36. Thus, the feedback signal 44 is operable to adjust the output signal 40 generated by the secondary RF device 30 in order to keep the output signal 40 within a specified range.

In addition, the primary bias control 22 is coupled to the feedback circuit 34. The primary bias control 22 is operable to provide the feedback signal 44 from the feedback circuit 34 to the primary RF device 12. The primary RF device 12 is operable to generate the RF output signal 26 based on the feedback signal 44 from the primary bias control 22. Thus, the feedback signal 44 is also operable to adjust the RF output signal 26 generated by the primary RF device 12 in order to keep the RF output signal 26 within a specified range, thereby stabilizing the primary RF device 12.

In operation, the primary RF device 12 receives an RF input signal 24 and generates an RF output signal 26 based on the RF input signal 24 and the feedback signal 44 received from the bias point stabilizer 20 through the primary bias control 22. The secondary RF device 30 also receives the feedback signal 44 and generates the output signal 40 based on the feedback signal 44.

The feedback circuit 34 receives the output signal 40 and the reference signal 42 and generates the feedback signal 44 based on those received signals 40 and 42. The secondary bias control 36 provides the feedback signal 44 to the secondary RF device 30 and the operation continues with the secondary RF device 30 continuously being monitored and adjusted by the feedback circuit 34 in order to generate the appropriate feedback signal 44 to be provided to the primary RF device 12 for stabilization.

FIG. 2 is a block diagram illustrating details of the system 10 in accordance with one embodiment of the present invention. In this embodiment, the primary RF device 12 comprises an amplifier. However, as previously described, the primary RF device 12 may comprise a mixer, a synthesizer, or other suitable device operable to process an RF signal.

For the illustrated embodiment, the primary bias control 22 comprises a variable current source that is operable to provide a specified current to the primary RF device 12 based on the feedback signal 44 from the bias point stabilizer 20. In addition, the secondary bias control 36 comprises a variable current source that is operable to provide a specified current to the secondary RF device 30 based on the feedback signal 44.

The secondary RF device 30 of the illustrated embodiment comprises a circuit that is analogous to the primary RF device 12. In the illustrated embodiment, the system 10 also comprises an amplifier 50 that is operable to amplify the magnitude of the feedback signal 44 before providing the amplified feedback signal 52 to the primary bias control 22. Thus, for this embodiment, the secondary RF device 30 may comprise transistors and other circuit components that are a specified multiple or fraction of the transistors and other circuit components of the primary RF device 12. For example, if the transistors and other circuit components of the secondary RF device 30 are half the size of the transistors and other circuit components of the primary RF device 12, the amplifier 50 may amplify the feedback signal 44 by a factor of two before providing this amplified feedback signal 52 to the primary bias control 22. It will be understood that, for the embodiment in which the secondary RF device 30 comprises transistors and other circuit components that are the same size as the transistors and other circuit components of the primary RF device 12, the system 10 may not use an amplifier 50.

In addition, the secondary RF device 30 of the illustrated embodiment comprises a circuit that is configured as an oscillator. Because of this configuration, the secondary RF device 30 is operable to oscillate at a frequency of $1/\sqrt{(2\pi LC)}$ with an amplitude that results in a gain of unity. If the gain of the oscillator increases to greater than unity, the amplitude increases until the oscillation limits and reduces the gain to unity due to the non-linear nature of the limiting. If the gain of the oscillator decreases to less than unity, the amplitude decreases, which increases the gain. Thus, by amplitude-controlling the oscillator, the amplifier bias point is forced to the appropriate level to result in unity gain while maintaining linear amplification.

The feedback circuit 34 of the illustrated embodiment comprises a peak detector 58 and an operational amplifier 60. The peak detector 58 is coupled to the secondary RF device 30 and is operable to receive the output signal 40 from the secondary RF device 30. The peak detector 58 is also operable to detect an oscillation magnitude for the output signal 40 and to generate an oscillation magnitude signal 62 based on this detected oscillation magnitude.

The operational amplifier 60 comprises an inverting input node 64 that is operable to receive the reference signal 42 from the reference circuit 32. The operational amplifier 60 also comprises a non-inverting input node 66 that is operable to receive the oscillation magnitude signal 62 from the peak detector 62. Based on the difference between these two signals 42 and 62, the operational amplifier 60 is operable to generate the feedback signal 44 at an output node 68.

In operation, the primary RF device 12 receives an RF input signal 24 and generates an RF output signal 26 based on the RF input signal 24 and the feedback signal 44 received from the bias point stabilizer 20 through the primary bias control 22. The secondary RF device 30 also receives the feedback signal 44 and generates the output signal 40 based on the feedback signal 44.

The peak detector 58 of the feedback circuit 34 receives the output signal 40 and generates the oscillation magnitude signal 62 based on the output signal 40. The operational amplifier 60 of the feedback circuit 34 receives the reference signal 42 at the inverting input node 64 and receives the oscillation magnitude signal 62 at the non-inverting input node 66. The operational amplifier 60 then generates the feedback signal 44 based on the difference between the two received signals 42 and 62.

The secondary bias control 36 adjusts the current to the secondary RF device 30 based on the feedback signal 44 and the operation continues with the secondary RF device 30 continuously being monitored and adjusted by the secondary bias control 36, in conjunction with the feedback circuit 34, in order to generate the appropriate feedback signal 44 to be provided to the primary RF device 12 for stabilization.

The optional amplifier 50 also receives the feedback signal 44 and amplifies the feedback signal 44 to generate the amplified feedback signal 52. The primary bias control 22 adjusts the current to the primary RF device 12 based on the amplified feedback signal 52 in order to stabilize the primary RF device 12.

FIG. 3 is a flow diagram illustrating a method for stabilizing the performance variation of the primary RF device 12 in accordance with one embodiment of the present invention. The method begins at step 100 where a secondary RF device 30 that is analogous to the primary RF device 12 is provided.

At step 102, the secondary RF device 30 generates the output signal 40. At step 104, the feedback circuit 34 receives the output signal 40 from the secondary RF device 30 and receives the reference signal 42 from the reference circuit 32. At step 106, the feedback circuit 34 generates the feedback signal 44 based on the output signal 40 and the reference signal 42.

At step 108, the feedback circuit 34 provides the feedback signal 44 to the secondary RF device 30 through the secondary bias control 36. At step 110, the secondary RF device 30 generates the output signal 40 based on the feedback signal 44. At step 112, the feedback circuit 34 provides the feedback signal 44 to the primary RF device 12 through the primary bias control 22.

In this way, the RF performance of the secondary RF device 30 may be directly measured within the bias point stabilizer 20, and the resulting measurement may be provided to the primary RF device 12 by way of the feedback signal 44 through the primary bias control 22. Accordingly, the gain of the primary RF device 12 over temperature, manufacturing process, and power supply variation is stabilized based on a direct measurement as opposed to an empirical relationship.

Although the present invention has been described with several embodiments, various changes and modifications may be suggested to one skilled in the art. It is intended that the present invention encompass such changes and modifications as fall within the scope of the appended claims.

What is claimed is:

1. A method for stabilizing performance variation of a primary radio frequency (RF) device, comprising:
   generating an output signal with a secondary RF device;
   providing the output signal to a feedback circuit;
   generating a feedback signal based on the output signal with the feedback circuit;
   providing the feedback signal to the secondary RF device;
   generating the output signal with the secondary RF device based on the feedback signal; and
   providing the feedback signal to the primary RF device.

2. The method of claim 1, further comprising receiving a reference signal; and
   wherein generating the feedback signal comprises generating the feedback signal based on the reference signal.

3. The method of claim 2, the reference signal comprising a reference voltage.

4. The method of claim 1, the secondary RF device configured as an oscillator.

5. The method of claim 4, the feedback circuit comprising a peak detector, the method further comprising:
   receiving the output signal at the peak detector; and
   detecting an oscillation magnitude for the output signal with the peak detector.

6. The method of claim 1, further comprising amplifying the feedback signal to generate an amplified feedback signal; and
   wherein providing the feedback signal to the primary RF device comprises providing the amplified feedback signal to the primary RF device.

7. The method of claim 1, wherein:
provide the feedback signal to the primary RF device comprises providing the feedback signal to the primary RF device through a primary bias control; and
providing the feedback signal to the secondary RF device comprises providing the feedback signal to the secondary RF device through a secondary bias control.

8. A system for stabilizing performance variation of a primary radio frequency (RF) device, comprising:
a secondary RF device operable to generate an output signal; and
a feedback circuit coupled to the secondary RF device, the feedback circuit operable to receive the output signal, to generate a feedback signal based on the output signal, to provide the feedback signal to the secondary RF device, and to provide the feedback signal to the primary RF device;
wherein the secondary RF device is further operable to generate the output signal based on the feedback signal.

9. The system of claim 8, further comprising a reference circuit coupled to the feedback circuit, the reference circuit operable to generate a reference signal, the feedback circuit operable to generate the feedback signal based on the reference signal.

10. The system of claim 9, the reference signal comprising a reference voltage.

11. The system of claim 8, the secondary RF device configured as an oscillator.

12. The system of claim 11, the feedback circuit comprising a peak detector operable to receive the output signal and to detect an oscillation magnitude for the output signal.

13. The system of claim 8, further comprising an amplifier coupled to the feedback circuit, the amplifier operable to amplify the feedback signal to generate an amplified feedback signal and to provide the amplified feedback signal to the primary RF device.

14. The system of claim 8, further comprising:
a primary bias control coupled to the primary RF device and to the feedback circuit, the primary bias control operable to provide the feedback signal to the primary RF device; and
a secondary bias control coupled to the secondary RF device and to the feedback circuit, the secondary bias control operable to provide the feedback signal to the secondary RF device.

15. A system for processing a radio frequency (RF) signal, comprising:
a primary RF device; and
a bias point stabilizer coupled to the primary RF device, the bias point stabilizer comprising a secondary RF device operable to generate an output signal, the bias point stabilizer operable to generate a feedback signal based on the output signal and to provide the feedback signal to the primary RF device and the secondary RF device, the feedback signal operable to stabilize the primary RF device.

16. The system of claim 15, the bias point stabilizer further comprising a feedback circuit coupled to the secondary RF device;
the feedback circuit operable to receive the output signal, to generate the feedback signal based on the output signal, to provide the feedback signal to the secondary RF device, and to provide the feedback signal to the primary RF device;
the secondary RF device operable to generate the output signal bused on the feedback signal.

17. The system of claim 16, the bias point stabilizer further comprising a reference circuit coupled to the feedback circuit, the reference circuit operable to generate a reference signal, the feedback circuit operable to generate the feedback signal based on the reference signal.

18. The system of claim 17, the reference signal comprising a reference voltage.

19. The system of claim 16, the secondary RF device configured as an oscillator, the feedback circuit comprising a peak detector operable to receive the output signal, to detect an oscillation magnitude for the output signal, and to generate an oscillation magnitude signal based on the detected oscillation magnitude.

20. The system of claim 19, the feedback circuit further comprising an operational amplifier, the operational amplifier comprising an inverting input node operable to receive the reference signal, a non-inverting input node operable to receive the oscillation magnitude signal, and an output node operable to generate the feedback signal based on the reference signal and the oscillation magnitude signal.

* * * * *

UNITED STATES PATENT AND TRADEMARK OFFICE
CERTIFICATE OF CORRECTION

| | | |
|---|---|---|
| PATENT NO. | : 7,058,360 B1 | Page 1 of 1 |
| APPLICATION NO. | : 10/071150 | |
| DATED | : June 6, 2006 | |
| INVENTOR(S) | : Daniel R. Meacham | |

It is certified that error appears in the above-identified patent and that said Letters Patent is hereby corrected as shown below:

Column 8, claim 16, line 22, delete "bused" and replace with --based--.

Signed and Sealed this

Second Day of January, 2007

JON W. DUDAS
*Director of the United States Patent and Trademark Office*